(12) United States Patent
Kittl et al.

(10) Patent No.: US 10,170,549 B2
(45) Date of Patent: Jan. 1, 2019

(54) STRAINED STACKED NANOSHEET FETS AND/OR QUANTUM WELL STACKED NANOSHEET

(71) Applicant: Samsung Electronics Co., Ltd., Gyeonggi-do (KR)

(72) Inventors: Jorge A. Kittl, Round Rock, TX (US); Borna J. Obradovic, Leander, TX (US); Robert C. Bowen, Austin, TX (US); Mark S. Rodder, Dallas, TX (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 172 days.

(21) Appl. No.: 14/918,954

(22) Filed: Oct. 21, 2015

(65) Prior Publication Data

US 2016/0111284 A1    Apr. 21, 2016

Related U.S. Application Data

(60) Provisional application No. 62/066,367, filed on Oct. 21, 2014.

(51) Int. Cl.
*H01L 29/06* (2006.01)
*H01L 21/02* (2006.01)
(Continued)

(52) U.S. Cl.
CPC ...... *H01L 29/0669* (2013.01); *H01L 21/0245* (2013.01); *H01L 21/02463* (2013.01);
(Continued)

(58) Field of Classification Search
CPC ............ H01L 29/0665; H01L 29/0669; H01L 29/0673; H01L 29/42392; H01L 29/78696;
(Continued)

(56) References Cited

U.S. PATENT DOCUMENTS 5,294,808 A    3/1994    Lo et al.
5,357,119 A    10/1994   Wang et al.
(Continued)

FOREIGN PATENT DOCUMENTS

EP    0540235    5/1993

OTHER PUBLICATIONS

U.S. Appl. No. 14/830,622, titled "Rectangular Nanosheet Fabrication," filed Aug. 19, 2015 and assigned to Samsung Electronics Co., Ltd.
(Continued)

*Primary Examiner* — Fernando L Toledo
*Assistant Examiner* — Aaron Gray
(74) *Attorney, Agent, or Firm* — Van Pelt, Yi & James LLP

(57) ABSTRACT

Exemplary embodiments provide for fabricating a nanosheet stack structure having one or more sub-stacks. Aspects of the exemplary embodiments include: growing an epitaxial crystalline initial stack of one or more sub-stacks, each of the sub-stacks having at least three layers, a sacrificial layer A, and at least two different non-sacrificial layers B and C having different material properties, wherein the non-sacrificial layers B and C layers are kept below a thermodynamic or kinetic critical thickness corresponding to metastability during all processing, and wherein the sacrificial layer An is placed only at a top or a bottom of each of the sub-stacks, and each of the sub-stacks is connected to an adjacent sub-stack at the top or the bottom using one of the sacrificial layers A; proceeding with fabrication flow of nanosheet devices, such that pillar structures are formed at each end of the epitaxial crystalline stack that to hold the nanosheets in place after selective etch of the sacrificial layers; and selectively removing sacrificial layers A to all non-sacrificial layers B and C, while the remaining layers in the stack are
(Continued)

held in place by the pillar structures so that after removal of the sacrificial layers An, each of the sub-stacks contains the non-sacrificial layers B and C.

33 Claims, 3 Drawing Sheets

(51) Int. Cl.
  *H01L 29/10* (2006.01)
  *H01L 29/778* (2006.01)
(52) U.S. Cl.
  CPC .. H01L 21/02466 (2013.01); H01L 21/02505 (2013.01); H01L 21/02532 (2013.01); H01L 21/02546 (2013.01); H01L 21/02549 (2013.01); H01L 29/0665 (2013.01); H01L 29/1054 (2013.01); H01L 29/7782 (2013.01); H01L 29/7783 (2013.01); H01L 29/7781 (2013.01)
(58) Field of Classification Search
  CPC ........... H01L 29/66439; H01L 29/7789; H01L 29/7782; H01L 21/0245; H01L 21/02505; H01L 21/02532
  USPC ...... 257/9, 190, 401, E29.168; 438/478, 492
  See application file for complete search history.

(56) References Cited

U.S. PATENT DOCUMENTS

| | | | |
|---|---|---|---|
| 6,313,486 B1 | 11/2001 | Kencke et al. | |
| 6,831,350 B1 | 12/2004 | Liu et al. | |
| 6,906,400 B2 | 6/2005 | Delhougne et al. | |
| 7,244,972 B2 | 7/2007 | Kubo et al. | |
| 7,485,539 B2 | 2/2009 | Adam et al. | |
| 7,608,496 B2 | 10/2009 | Chu | |
| 7,820,523 B2 | 10/2010 | Andrieu et al. | |
| 8,847,281 B2 | 9/2014 | Cea et al. | |
| 8,906,789 B2 | 12/2014 | Tsai et al. | |
| 2007/0148890 A1 | 6/2007 | Enicks | |
| 2011/0003451 A1* | 1/2011 | Orlowski | H01L 29/42392 438/285 |
| 2012/0104355 A1 | 5/2012 | Grandusky | |
| 2013/0134444 A1 | 5/2013 | Adam | |
| 2013/0196469 A1 | 8/2013 | Facchetti | |
| 2013/0244016 A1 | 9/2013 | Osada | |
| 2013/0270512 A1* | 10/2013 | Radosavljevic | H01L 21/823821 257/9 |
| 2013/0277714 A1* | 10/2013 | Le | H01L 29/42392 257/190 |
| 2014/0001603 A1 | 2/2014 | Enicks | |
| 2014/0197459 A1 | 7/2014 | Kis | |
| 2014/0252316 A1 | 9/2014 | Yan | |
| 2014/0291733 A1 | 10/2014 | Eung | |

OTHER PUBLICATIONS

"Polymer-assisted synthesis of colloidal germanium telluride nano-octahedra, nanospheres, and nanosheets," M. R. Buck; A. J. Biacchi; E. J. Popczun; R. E. Schaak, Chemistry of Materials, vol. 25, No. 10, pp. 2163-2171, Apr. 17, 2013 http://dx.doi.org/10.1021/cm4009656.

"Carbon-based materials: Growth, properties, MEMS/NEMS technologies, and MEM/NEM switches," M. Liao; Y. Koide, Critical Reviews in Solid State and Materials Sciences, vol. 36, No. 2, pp. 66-101, Jun. 9, 2011 http://dx.doi.org/10.1080/10408436.2011.572748.

"Electronics based on 2D-materials," G. Fiori; F. Bonaccorso; G. Innaccone; T. Palacios; D. Neumaier; A. Seabaugh; S. K. Banerjee; L. Colombo, Iannaccone Nature Nano Preprint, pp. 1-23, 2014. http://www.iannaccone.org/wp-content/uploads/Fiori_Naturenano_Preprint_2014.pdf.

* cited by examiner

US 10,170,549 B2

STRAINED STACKED NANOSHEET FETS AND/OR QUANTUM WELL STACKED NANOSHEET

CROSS-REFERENCE TO RELATED APPLICATIONS

This application claims the benefit of priority of provisional Patent Application Ser. No. 62/066,367 filed on Oct. 21, 2014. This application is also related to patent application Ser. No. 14/830,622 (ALL002US) filed on Aug. 19, 2015, both assigned to the assignee of the present application and herein incorporated by reference.

BACKGROUND

Nanosheet field effect transistors (FETs) are an attractive alternative to Fin FETs or planar devices for future CMOS nodes. In typical nanosheet FET approach, a single material nanosheet is used, since for electrostatic control very thin nanosheets are targeted. It is difficult to strain the nanosheet, which would boost mobility for many materials, including Si, SiGe or Ge nanosheets. A method to effectively achieve strained nanosheets would be beneficial for CMOS scaling.

In addition, quantum well channels in which the carriers are restricted mainly to one or some layers (arranged in epitaxial relation with each other), by a potential barrier at the interfaces with adjacent crystalline (epitaxially arranged) layers can give an advantage in transport. A method to effectively achieve QW structured nanosheets would be beneficial for CMOS scaling.

BRIEF SUMMARY

Exemplary embodiments provide for fabricating a nanosheet stack structure having one or more sub-stacks. Aspects of the exemplary embodiments include: growing an epitaxial crystalline initial stack of one or more sub-stacks, each of the sub-stacks having at least three layers, a sacrificial layer A, and at least two different non-sacrificial layers B and C having different material properties, wherein the non-sacrificial layers B and C are kept below a thermodynamic or kinetic critical thickness corresponding to metastability during all processing; and wherein the sacrificial layers A are placed only at a top or a bottom of each of the sub-stacks, and each of the sub-stacks is connected to an adjacent sub-stack at the top or the bottom using one of the sacrificial layers A; proceeding with fabrication flow of nanosheet devices, such that pillar structures are formed at each end of the epitaxial crystalline stack that to hold the nanosheets in place after selective etch of the sacrificial layers; and selectively removing sacrificial layers A to all non-sacrificial layers B and C, while the remaining layers in the stack are held in place by the pillar structures so that after removal of the sacrificial layers A, each of the sub-stacks contains the non-sacrificial layers B and C. In the preferred embodiments, the stack and/or the layers present at a given step in the flow are kept below the thermodynamic or kinetic (metastable) critical thickness during all processing until finalization of the whole chip.

BRIEF DESCRIPTION OF SEVERAL VIEWS OF THE DRAWINGS

These and/or other features and utilities of the present general inventive concept will become apparent and more readily appreciated from the following description of the embodiments, taken in conjunction with the accompanying drawings of which.

DETAILED DESCRIPTION

Figure 1:
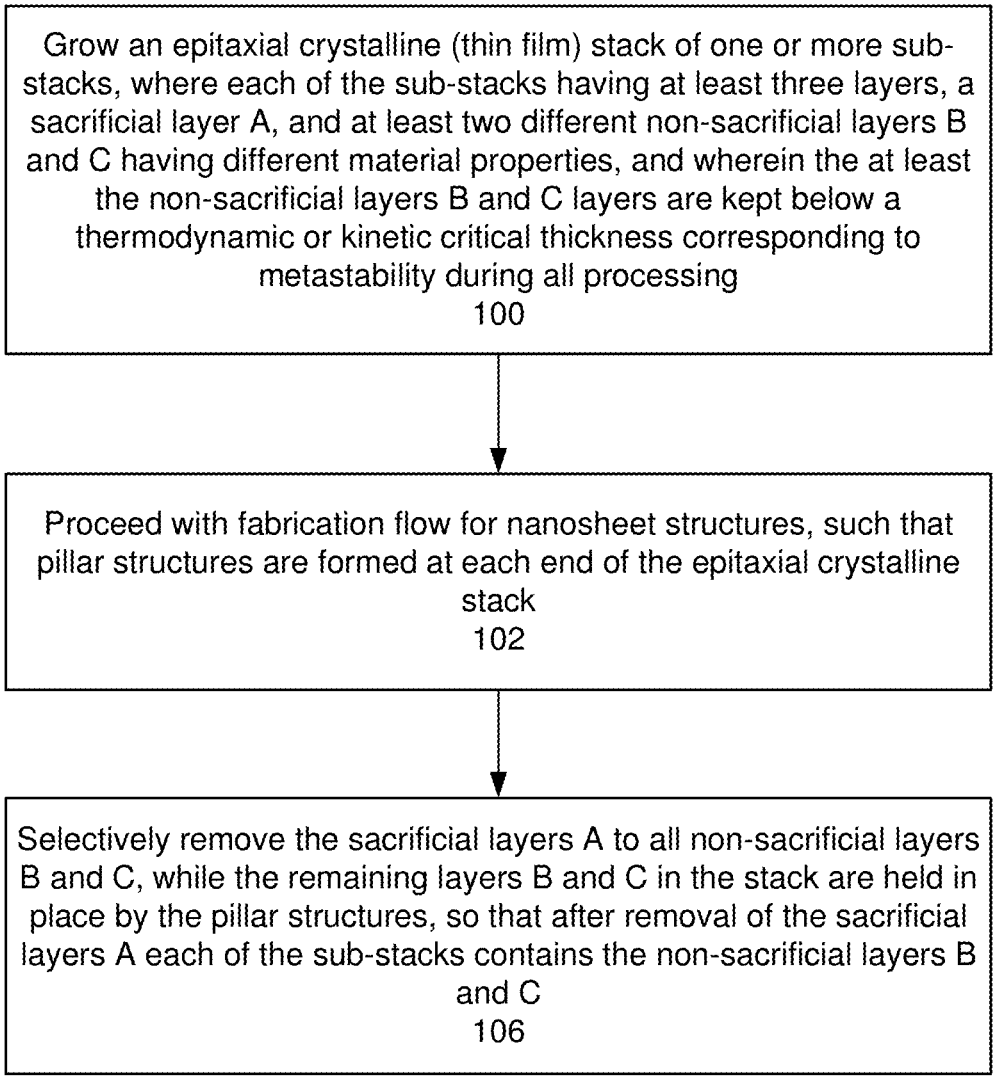
FIG. 1 is a flow diagram illustrating a process for fabricating a nanosheet stack structure with strain and optional quantum well properties according to one embodiment.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Advantages and features of the present invention and methods of accomplishing the same may be understood more readily by reference to the following detailed description of embodiments and the accompanying drawings. The present general inventive concept may, however, be embodied in many different forms and should not be construed as being limited to the embodiments set forth herein. Rather, these embodiments are provided so that this disclosure will be thorough and complete and will fully convey the concept of the general inventive concept to those skilled in the art, and the present general inventive concept will only be defined by the appended claims. In the drawings, the thickness of layers and regions are exaggerated for clarity.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The exemplary embodiments provide a process to fabricate nanosheets with strain and/or quantum well properties. The process is based on an epitaxial growth of a crystalline stack, comprising several sub-stacks. Each of the sub-stacks may contain at least three different layers A, B and C, in epitaxial relation with each other. Each of the layers may contain sub-layers (all in epitaxial relation). In some embodiments, the sub-stacks are identical to each other, so that the crystalline stack repeats the same sub-stack.

FIG. 1 is a flow diagram illustrating a process for fabricating a nanosheet stack structure with strain and optional quantum well properties according to one embodiment. The processing steps described below are not necessarily immediate subsequent steps, but are incorporated (at the appropriate steps) into known flows for fabrication of nanosheet FET devices.

The process may begin by growing an epitaxial crystalline (thin film) stack of one or more sub-stacks (n sub-stacks), where each of the sub-stacks has at least three layers, a sacrificial layer A and at least two different non-sacrificial layers B and C having different material properties, and wherein the non-sacrificial layers B and C layers are kept below a thermodynamic or kinetic critical thickness corresponding to metastability during all processing (block 100). In the preferred embodiments, the stack and/or the layers present at a given step in the flow are kept below the thermodynamic or kinetic (metastable) critical thickness during all processing until finalization of the whole chip. In addition, the initial stack 200 is formed such that the sacrificial layer A is placed only at a top or a bottom of each of the sub-stacks 202, and each of the n sub-stacks 202 is connected to an adjacent sub-stack at the top or the bottom using one of the sacrificial layers A.

Figures 2A, 2B, 2C:
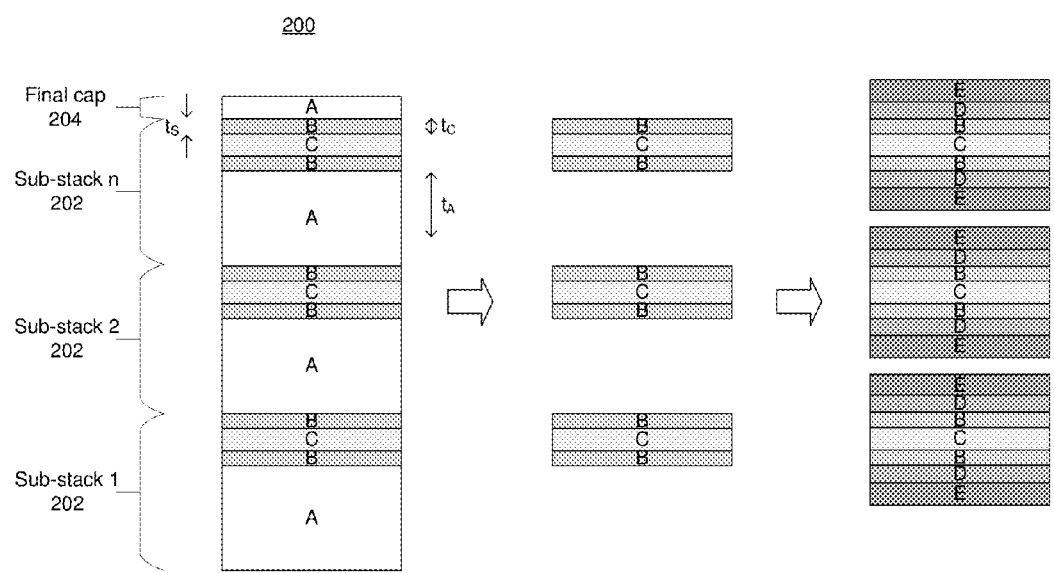
FIG. 2A is a diagram illustrating the stack after epitaxial growth.
FIG. 2B is a diagram showing the nanosheet structure formed by removal of the sacrificial layers, i.e., after nanosheet release.
FIG. 2C is a diagram illustrating the nanosheet structure with the addition of layers D and E forming a gate stack that is grown/deposited conformally.

FIG. 2A is a diagram showing an epitaxial growth of an initial crystalline stack from which a nanosheet structure is formed. The initial stack 200 is shown comprising n sub-stacks 202 where each of the sub-stacks 202 comprise at least three layers, a sacrificial layer A, and at least two different non-sacrificial layers B and C, where the sacrificial layer and the non-sacrificial layers may have different material properties. The sub-stacks 202 may differ from each other and their exact layer sequence, materials and thickness. In another embodiment, each layer may also comprise sub-layers (not shown).

In one embodiment, the sub-stacks 202 may be identical to each other so that the crystalline stack comprises a repetition of the same sub-stack. In alternative embodiments, the structure of at least one of the sub-stacks 202 may vary, as shown below in FIG. 3. In the example shown in FIG. 2A, the stacks are identical and the stack is completed with a final cap 204 of the sacrificial layer A.

Referring again to FIG. 1, fabrication of nanosheet FET devices proceeds, such that pillar structures are formed at each end (source and drain) of the epitaxial crystalline stack that will hold the nanosheets in place after selective etch of the sacrificial layers (block 102).

The sacrificial layers A are then selectively removed to all non-sacrificial layers B and C, while the remaining layers in the stack 200 are held in place by the pillar structures, so that after removal of the sacrificial layers A, each of the sub-stacks contains the non-sacrificial layers B and C (block 106). The stack 200 may be designed so that layers A in each sub-stack can be removed in an etch process (e.g., a wet etch) selectively with respect to all other layers in the stack (i.e., the etch process etches A at higher rate than B and C).

FIG. 2B shows the stack after removal of the sacrificial layer A, where non-sacrificial layers B and C remain in each sub-stack 202. The diagram in FIG. 2B is a schematic cross-section of a central portion of a nanosheet structure that omits source and drain end pillar structures (to the left and right of the portion shown in the diagrams). It should be understood that current flow direction is horizontal and lateral.

In some embodiment, the layers A, B and C in each sub-stack 202 are in epitaxial relation with each other, and the sub-layers (if any) of each layer are also all in epitaxial relation. In preferred embodiments, the stack is designed so that the stack and all layers are kept below the thermodynamic or kinetic (metastable) critical thickness, given the combination of layers present in the stack at a given step, during all processing until finalization of the whole chip; so that the final structure has a low density of defects (e.g. <$10^4$ $cm^{-2}$, per area of nanosheet in the preferred embodiment, and <$10^6$ $cm^{-2}$ in other embodiments). Layer thicknesses and thermal budgets during and following deposition are preferably designed to keep the layers with low defectivity and maintain the same lattice parameter through the sub-stack. Thin layers and low thermal budgets may help keep the layers defect free and help maintain the same lattice parameter.

In some embodiments, all layers in the stack comprise materials with less than 10% lattice mismatch. In some embodiments, the lattice mismatch may be kept below 5%. Since in preferred embodiments, the grown crystalline stack is designed so that the stack and all layers (and sub-layers) are kept below the thermodynamic or kinetic (metastable) critical thickness during all processing, in these embodiments all layers in the initially grown stack achieve effectively and substantially the same lattice parameter, which may be different than the lattice parameter of the materials composing the layers when in free relaxed state. Also, as a consequence of the stack design described above, at all times during processing and in the final state after processing of the integrated circuit is completed, for each sub-stack, there will be substantially one common lattice parameter for all the layers within the sub-stack. If the layers (or sub-layers) comprising the sub-stack are made of materials which have different lattice parameters in their relaxed state, then this implies that the layers (or sub-layers) within each sub-stack will remain strained throughout the process. However, since some layers of the stack are being removed throughout the process, the common lattice parameter for each sub-stack may be different at different steps in the process. Equivalently, the strain may be different at different steps in the process. Other embodiments are possible, including cases in which some layers are grown above critical thickness, including cases in which at some stages of the processing there are layers in the stack that have effectively different lattice parameters.

In some embodiments, the remaining sub-stack after removal of sacrificial layer A may comprise a central layer of material C, with additional layers of material B on top and below. The sub-stacks may be designed so that after removal of sacrificial layer A, layers, B and C within the sub-stack maintain an epitaxial relation and having effectively and substantially the same lattice parameter within the sub-stack in the preferred implementation, even if materials in the layers B and C have different lattice parameters in their relaxed state. In one embodiment, at least two layers in the sub-stacks have different lattice parameters in their relaxed state, leading to a strain in the layers when implemented in the sub-stack which maintains one lattice parameter throughout. In some embodiments, layers B and C are made of semiconducting materials which have a band offset for the relevant carriers so that a potential barrier for carriers is present between the layers.

In one embodiment, the nanosheet structure is used a part of a channel region of a MOSFET device and at least two non-sacrificial layers in the sub-stack 202 may have different band edge position for the relevant carriers (electrons for nMOS and holes for pMOS devices) so that a potential barrier for carriers is present between the layers (e.g. of >0.15 eV for the main carriers in the MOSFET). Yet in another embodiment, the non-sacrificial layers in the remaining sub-stack (after removal of sacrificial layer A) have different lattice parameter in their relaxed state but the same lattice parameter when implemented in the sub-stack (i.e., are strained within the sub-stack structure) and have different band edge position for the relevant carriers (electrons for nMOS and holes for pMOS devices) so that a potential barrier for carriers is present between the layers (e.g. of >0.15 eV).

In some embodiments, with the sub-stack structure as shown in FIG. 2A, layers B and C may comprise III-V semiconductor materials (e.g., alloys) with very similar (or same) lattice parameters. In some embodiments, layer B is InP and layer C may comprise a latticed matched InGaAs alloy. In other embodiments, layer B may comprise a InP or InAlAs alloy and layer C may comprise a latticed matched InGaAs alloy, with the composition of the InGaAs alloy chosen to have a less than 2% lattice mismatch to the adjacent InP or InAlAs layers. In another embodiment, the sub-stack may comprise InGaAs central layers and adjacent InP top and bottom layers, and the crystalline dielectric layers at top most and bottom most of each sub-stack after removal of the sacrificial layers A may comprise epitaxial rare earth oxides.

In some embodiments, layers A, B and C may comprise Si—Ge alloys (differing in composition). In some embodiments, the layers A comprises a SiGe alloy, and the layers B and C comprise SiGe alloys with lower Ge content than the layers A, and wherein the layers B and C have different Ge content. In some embodiments, layer A may be substantially pure Ge at approximately 90% or higher Ge content, layer B may be substantially a Si—Ge alloy with Ge content in the 25-75% range; and layer C may be substantially pure Si. Other implementations are possible.

In some implementations with sub-stack structure as shown in FIG. 2A, the layers may comprise the following:
  Layer C: approximately 3-4 nm of substantially Si or low Ge SiGe alloy (e.g. <20% Ge),
  Layer B: approximately 2-3 nm of approximately 40 to 80% Ge SiGe, and
  Layer A: approximately >10 nm of substantially pure Ge (e.g. >90% Ge). The resulting sub-stack after removal of layer A comprises primarily a tensely strained Si core, surrounded by a compressively strained SiGe layer (e.g. 40 to 75% Ge).

In some embodiments, with sub-stack structure shown in FIG. 2A, there may be a band offset for carriers between layers B and C, so that a quantum well structure is achieved. In some embodiments, carrier transport is preferentially through layers B due to QW effects.

Figure 3:
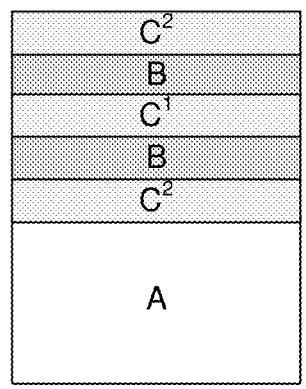
FIG. 3 is a diagram of an epitaxial growth of the initial crystalline stack showing an alternate example of a sub-stack.

FIG. 3 is a diagram of an epitaxial growth of an initial crystalline stack showing an alternate example of a sub-stack 203. In this example, the sub-stack 203 comprises sacrificial layer A and non-sacrificial layers B, $C^1$ and $C^2$. The sub-stack structure after removal of sacrificial layer A includes a central layer $C^1$, with layers B adjacent to $C^1$ on top and bottom, and layers $C^2$ adjacent to layers B, so that the top-most layer and bottom-most layer of the sub-stack are layers $C^2$. Many other combinations are possible.

In one embodiment, the B, $C^1$ and and $C^2$ layers may comprise semiconducting materials with a difference in lattice parameter among at least two of the layers, resulting in a strain in the layers. In some implementations, with sub-stack structure as shown in FIG. 3, the layers may comprise the following:
  Layer $C^1$: approximately 3-4 nm of substantially Si or low Ge SiGe alloy (e.g. <20% Ge),
  Layer B: approximately 2-3 nm of approximately 40 to 80% Ge SiGe,
  Layer $C^2$: between 0.4 and 1 nm of substantially pure Si or low Ge SiGe (e.g. <20% Ge), and
  Layer A: approximately >10 nm or thicker of substantially pure Ge (e.g. >90% Ge).

The resulting sub-stack after removal of A comprises primarily a tensely strained Si core surrounded by a compressively strained SiGe layer (e.g. 40 to 75% Ge) and a capping Si (or low Ge SiGe) layer.

In some embodiments, Layer C may comprise a high Ge SiGe alloy (e.g. 90% Ge or similar), layer B may comprise a III-V alloy or a II-VI alloy with a larger lattice parameter (in relaxed states) than the SiGe alloy in layer C and with a conduction band offset to layer C of >0.2 eV, preferably ~0.5 eV, such as an AlAsSb alloy (or similar). This results in very high tensile strain on the SiGe layer. There is also a fairly large CB offset between the SiGe and AlAsSb (up to ~0.5 eV), which will result in electrons being confined in the center of the B-C stack. The high strain and protection of the electron wavefunctions from the dielectric results in very high electron mobility.

In some embodiments, the non-sacrificial layer structure of each sub-stack may contain a core layer of a high Ge SiGe alloy at 90% Ge or higher, and adjacent layers above and below this core layer, comprising II-VI or III-V alloys (e.g., AlAsSb) that have in their relaxed state a larger lattice parameter than the SiGe alloy in the core layer and a conduction band offset so that the conduction band edge is higher than in the SiGe alloy core layer by approximately 0.15 eV or more.

Referring to FIG. 2C, a diagram is shown illustrating the nanosheet structure with the addition of layers D and E forming a gate stack (gate dielectric and gate electrode) that is grown/deposited conformally after removal of the sacrificial layers A. The process may include oxidation steps (including chemical oxidation in Ozonated wet treatments, etc.) and/or ALD and/or CVD depositions. For instance, in the embodiment where the nanosheet structure is used as a channel region of a MOSFET device, the method may further comprise completing isolation of the channel at exposed regions after removal of sacrificial layers A by oxidation or dielectric deposition techniques; and forming a gate dielectric and gate electrode by conformal deposition.

Layer D is typically a dielectric layer or stack and may include sublayers such as interface layers (IL) and high-k layers. Layer D may be amorphous or crystalline or combinations of both. In one embodiment, dielectric layer D may include formation of an IL and high-k layer on top by known methods in the art.

Layer D may contain deposition of a semiconductor (e.g., by CVD) as first layer (for implementations that do not include any insulating layer present in the stack after removal of sacrificial layer A). In some embodiments, this first semiconducting layer or semiconducting cap layer is a Si cap layer. In some embodiments, the semiconducting cap is added in this step as part of D. In some embodiments, this layer is a Si cap of less or approximately 1 nm.

In some embodiments, at least a portion of layer D can be grown as part of the initial stack (the fully crystalline epitaxial stack), and act as the crystalline insulator (not removed). This combines a fully crystalline insulator structure with the bi-axial-strain semiconductor multilayer concept. This may be particularly useful for devices in which the carrier concentration is peak in layer B (e.g. holes, in embodiments in which layer B is Ge-rich SiGe). In these embodiments, however, care needs to be taken to provide isolation between the channel and the gate electrode at the edges of the nanosheets; this can be accomplished by an oxidation step and/or additional dielectric deposition step performed after removal of layers A, but before deposition of gate electrode E. If an oxidation step is used, it can be designed to grow a thicker oxide layer on the edges of the sheets than on the top and bottom faces of the sheets which are covered by the crystalline dielectric. Considerations such as leakage and Tiny should dictate whether an oxidation step and/or an additional dielectric layer (which may be amorphous) are preferred.

Layer E is a gate electrode. Deposition can include conformal CVD or ALD films or combinations, and may contain several sub-layers.

Referring again to FIG. 3, in some embodiments, layer $C^2$ may be a crystalline dielectric, while layers $C^1$ and B are semiconductors ($C^1$ and B forming, for example, either a strained stack or QW stack as described). If a crystalline dieletric layer $C^1$ is used, then deposition of a dielectric layer D is optional and may be skipped, if other steps are taken to isolate a gate electrode layer E from the channel at the edges of the sheets. Otherwise, and oxidation step and/or dielectric deposition step (e.g., of dielectric D) may be performed after removal of layer A but before deposition of gate electrode E to isolate the gate electrode from the channel at the edges of the sheets. If an oxidation step is used, it can be designed to grow a thicker oxide layer on the edges of the sheets than on the top and bottom faces of the sheets which are covered by the crystalline dielectric. Considerations such as leakage and Tiny should dictate whether an oxidation step and/or an additional dielectric layer D (which may be amorphous) are preferred.

In one embodiment, the nanosheet structure described herein may be used as as part of a p-type or n-type field effect transistor (FET) device, wherein layers A, B, and C are formed by in-situ processes, the layers A, B and C lying substantially horizontal to a substrate, and wherein a channel region comprises at least portions of the layers B and C, and a gate stack surrounds the channel region.

In one embodiment, the FET is a p-type and the layers are strained, wherein the layers A comprise Ge-rich SiGe alloys at approximately 90% or higher Ge content, the layers B comprise intermediate Ge content SiGe alloys at approximately 40-80% Ge, and the layers C comprise Si-rich SiGe alloys at approximately less than 20% Ge.

In some embodiments, the FET is a p-type and the layers are strained, and the at least two non-sacrificial layers remaining in each sub-stack after selective removal of the sacrificial layers A comprise materials with different lattice parameters when in a relaxed state, and wherein the layers A comprise a Ge-rich SiGe alloy at approximately 90% Ge or higher, and the sub-stacks after removal of the layers A have a structure comprising: a bottom layer $C^2$ of a Si-rich SiGe alloy at approximately 20% Ge or less, adjacent to a layer B of an intermediate Ge content at 40 to 80% Ge, adjacent to a layer $C^1$ of a Si-rich SiGe alloy at 20% Ge or less, adjacent to a layer B of an intermediate Ge content at 40 to 80% Ge, adjacent to a top layer of a Si-rich SiGe alloy at 20% Ge or less.

In one embodiment, the layers C are approximately 3 to 4 nm thick, the layers B are approximately 2 to 3 nm thick and the layers A are approximately at least 10 nm thick.

In one embodiment, where the FET is a p-type or n-type, the non-sacrificial layers remaining in each sub-stack after selective removal of layers A may comprise semiconducting materials with a band edge offset of at least 0.15 eV for the main carriers in the MOSFET, and the non-sacrificial layers of semiconducting materials may be made of III-V alloys.

In one embodiment, the non-sacrificial layer structure of each sub-stack contains a semiconducting core comprising a central layer of an InGaAs alloy with adjacent layers of InP or InAlAs, with the composition of the InGaAs alloy chosen to have a less than 2% lattice mismatch to the adjacent InP or InAlAs layers.

In some embodiments, where the FET is an n-type with the layers strained, the non-sacrificial layers remaining in each sub-stack after selective removal of layers A may comprise semiconducting materials with a band edge offset of at least 0.15 eV for the main carriers in the MOSFET. The non-sacrificial layer structure of each sub-stack may contain a core layer of a high Ge SiGe alloy at 90% Ge or higher and layers adjacent above and below this core layer, comprising II-VI or III-V alloys that have in their relaxed state a larger lattice parameter than the SiGe alloy in the core layer and a conduction band offset so that the conduction band edge is higher than in the SiGe alloy core layer by approximately 0.15 eV or more. In one embodiment, where the FET is an n-type with the layers strained, the adjacent layers may be made of an AlAsSb alloy.

A method and system for fabricating a fabricating a nanosheet stack structure having one or more sub-stacks has been disclosed. The present invention has been described in accordance with the embodiments shown, and there could be variations to the embodiments, and any variations would be within the spirit and scope of the present invention. Accordingly, many modifications may be made by one of ordinary skill in the art without departing from the spirit and scope of the appended claims.

Although in many implementations all sub-stacks have nominally the same layer structure, in some embodiments different sub-stacks may have different layer structures. An index, n, can be assigned in this case to differentiate layers in different sub-stacks; for example layers An, Bn and Cn may form sub-stack n.

We claim:

1. A method for fabricating a nanosheet stack structure having one or more sub-stacks, the method comprising:
   growing an epitaxial crystalline initial stack of the one or more sub-stacks, each of the sub-stacks having at least three layers, a sacrificial layer A, and at least two different non-sacrificial layers B and C having different material properties, wherein the non-sacrificial layers B and C layers are each kept below a thermodynamic or kinetic critical thickness corresponding to metastability during all processing such that the non-sacrificial layers B and C remain metastable and without relaxation during processing, and wherein the sacrificial layer A is placed only at a top or a bottom of each of the sub-stacks, and each of the sub-stacks is connected to an adjacent sub-stack at the top or the bottom using one of the sacrificial layers A;
   proceeding with fabrication flow of nanosheet devices, such that pillar structures are formed at each end of the epitaxial crystalline stack that hold the nanosheets in place after selective etch of the sacrificial layers; and
   selectively removing sacrificial layers A from all non-sacrificial layers B and C, while the remaining layers B and C in the stack are held in place by the pillar structures, so that after removal of the sacrificial layers A, each of the sub-stacks contains the non-sacrificial layers B and C, the sacrificial layer A differing from the non-sacrificial layers B and C such that removal of the sacrificial layer A leaves the non-sacrificial layer B and the non-sacrificial layer C in all of the plurality of sub-stacks and such that no sub-stack includes the non-sacrificial layer B in the absence of the non-sacrificial layer C and no sub-stack includes the non-sacrificial layer C in the absence of the non-sacrificial layer B, the sacrificial layer A being at least three times as thick as the non-sacrificial layer B and as the non-sacrificial layer C.

2. The method of claim 1, wherein the selective removal of the sacrificial layers A is accomplished using a wet etch process.

3. The method of claim 1, wherein relaxed lattice parameters of materials comprising all layers of the initial stack are within 10% of each other.

4. The method of claim 1, wherein relaxed lattice parameters of materials comprising all layers of the initial stack are within 5% of each other.

5. The method of claim 1, wherein all layers in the stack are kept with substantially the same lattice parameter throughout the whole fabrication process.

6. The method of claim 5, wherein the at least two non-sacrificial layers remaining in each sub-stack after selective removal of the sacrificial layers A comprise materials with different lattice parameters when in a relaxed state.

7. The method of claim 5, wherein the nanosheet structure is used a part of a channel region of a MOSFET device, and wherein the at least two non-sacrificial layers remaining in each sub-stack after selective removal of layers A comprise semiconducting materials with a band edge offset of at least 0.15 eV for the main carriers in the MOSFET.

8. The method of claim 5, wherein the nanosheet structure is used a part of a channel region of the MOSFET device, and wherein the at least two non-sacrificial layers remaining in each sub-stack after selective removal of the sacrificial layers A comprise materials with different lattice parameters when in a relaxed state.

9. The method of claim 8, wherein the layers A comprises a SiGe alloy, wherein the layers B and C comprise SiGe alloys with lower Ge content than the layers A, and wherein the layers B and C have different Ge content.

10. The method of claim 9, wherein the layers A comprise SiGe alloys at approximately 90% or higher Ge content, the layers B comprise intermediate Ge content SiGe alloys at approximately 40-80% Ge, and the layers C comprise SiGe alloys at approximately less than 20% Ge.

11. The method of claim 10, wherein after removal of layers A the sub-stacks have a structure comprising a bottom layer B, a center layer Cn and a top layer B.

12. The method of claim 11, wherein the layers Cn are approximately 3 to 4 nm thick, the layers B are approximately 2 to 3 nm thick and the layers A are approximately at least 10 nm thick.

13. The method of claim 8, wherein at least one of the sub-stacks comprises the sacrificial layer A, the non-sacrificial layer B, and non-sacrificial layers $C^1$ and $C^2$, wherein the layer A comprises a SiGe alloy at approximately 90% Ge or higher, and the at least one sub-stack after removal of the layers A has a structure comprising: a bottom layer $C^2$ of a SiGe at approximately 20% Ge or less, adjacent to the layer B of SiGe at 40 to 80% Ge, adjacent to a layer $C^1$ of SiGe at 20% Ge or less, adjacent to the layer B, adjacent to a top Si layer.

14. The method of claim 13, wherein the layer $C^1$ is approximately 3 to 4 nm thick, the layer B is approximately 2 to 3 nm thick, the layer $C^2$ is approximately 0.4 to 1 nm and the layer A is approximately 10 nm thick.

15. The method of claim 1, wherein the nanosheet structure is used a part of a channel region of a MOSFET device, and wherein the at least two non-sacrificial layers remaining in each sub-stack after selective removal of layers A comprise semiconducting materials with a band edge offset of at least 0.15 eV for the main carriers in the MOSFET.

16. The method of claim 15, wherein the non-sacrificial layers of semiconducting materials are made of III-V alloys.

17. The method of claim 16, wherein the non-sacrificial layer structure of each substack contains a semiconducting core comprising a central layer of an InGaAs alloy with adjacent layers of InP or InAlAs, with the composition of the InGaAs alloy chosen to have a less than 2% lattice mismatch to the adjacent InP or InAlAs layers.

18. The method of claim 7, wherein the non-sacrificial layer structure of each sub-stack contains a core layer of a high Ge SiGe alloy at 90% Ge or higher and layers adjacent above and below this core layer, comprising II-VI or III-V alloys that have in their relaxed state a larger lattice parameter than the SiGe alloy in the core layer and a conduction band offset so that the conduction band edge is higher than in the SiGe alloy core layer by approximately 0.15 eV or more.

19. The method of claim 18, wherein the adjacent layers are made of an AlAsSb alloy.

20. The method of claim 1, wherein the nanosheet structure is used a part of a channel region of a MOSFET device, and wherein the at least two non-sacrificial layers remaining in each sub-stack after selective removal of layers A comprise semiconducting materials, the method further comprising: forming a gate dielectric and gate electrode by conformal deposition after removal of the sacrificial layers A.

21. The method of claim 1, wherein the nanosheet structure is used a part of a channel region of a MOSFET device, and wherein the at least two non-sacrificial layers remaining in each sub-stack after selective removal of layers A comprise a core of semiconducting materials with epitaxial crystalline dielectric layers on top and below, the method further comprising:
  completing isolation of the channel at exposed regions after removal of sacrificial layers A by oxidation or dielectric deposition techniques; and
  forming a gate dielectric and gate electrode by conformal deposition.

22. The method of claim 21, wherein the non-sacrificial layers in each sub-stack comprise core of III-V semiconductor materials, including InGaAs central layers and adjacent InAlAs top and bottom layers, or InGaAs central layers and adjacent InP top and bottom layers, and the crystalline dielectric layers at top most and bottom most of each sub-stack after removal of the sacrificial layers A are epitaxial rare earth oxides.

23. The method of claim 1, wherein the nanosheet structure is used as part of a FET device, wherein layers A, B, and C are formed by in-situ processes, the layers A, B and C lying substantially horizontal to a substrate, and wherein a channel region comprises at least portions of the layers B and C, and a gate stack surrounds the channel region.

24. The method of claim 23, wherein the FET is a p-type or n-type.

25. The method of claim 24, wherein the FET is a p-type and the layers are strained, wherein the layers A comprise Ge-rich SiGe alloys at approximately 90% or higher Ge content, the layers B comprise intermediate Ge content SiGe alloys at approximately 40-80% Ge, and the layers C comprise Si-rich SiGe alloys at approximately less than 20% Ge.

26. The method of claim 24, wherein the FET is a p-type and the layers are strained, wherein after removal of layers A the sub-stacks have a structure comprising a bottom layer B, a center layer C and a top layer B.

27. The method of claim 24, wherein the FET is a p-type and the layers are strained, wherein the at least two non-sacrificial layers remaining in each sub-stack after selective removal of the sacrificial layers A comprise materials with different lattice parameters when in a relaxed state, and wherein the layers A comprise a Ge-rich SiGe alloy at approximately 90% Ge or higher, and the sub-stacks after removal of the layers A have a structure comprising: a bottom layer $C^2$ of a Si-rich SiGe alloy at approximately 20% Ge or less, adjacent to a layer B of an intermediate Ge content at 40 to 80% Ge, adjacent to a layer $C^1$ of a Si-rich SiGe alloy at 20% Ge or less, adjacent to a layer B of an intermediate Ge content at 40 to 80% Ge, adjacent to a top layer of a Si-rich SiGe alloy at 20% Ge or less.

28. The method of claim 27, wherein the layers $C^1$n are approximately 3 to 4 nm thick, the layers B are approximately 2 to 3 nm thick, the layers $C^2$ are approximately 0.4 to 1 nm and the layers A are approximately 10 nm thick or thicker.

29. The method of claim 24, wherein the FET is a p-type, wherein the at least two non-sacrificial layers remaining in each sub-stack after selective removal of layers A comprise semiconducting materials with a band edge offset of at least 0.15 eV for the main carriers in the MOSFET, and wherein the non-sacrificial layers of semiconducting materials are made of III-V alloys.

30. The method of claim 24, wherein the FET is an n-type, wherein the at least two non-sacrificial layers remaining in each sub-stack after selective removal of layers A comprise semiconducting materials with a band edge offset of at least 0.15 eV for the main carriers in the MOSFET, and wherein the non-sacrificial layers of semiconducting materials are made of III-V alloys.

31. The method of claim 24, wherein the non-sacrificial layer structure of each sub-stack contains a semiconducting core comprising a central layer of an InGaAs alloy with adjacent layers of InP or InAlAs, with the composition of the InGaAs alloy chosen to have a less than 2% lattice mismatch to the adjacent InP or InAlAs layers.

32. The method of claim 24, wherein the FET is an n-type with the layers strained, wherein the at least two non-sacrificial layers remaining in each sub-stack after selective removal of layers A comprise semiconducting materials with a band edge offset of at least 0.15 eV for the main carriers in the MOSFET, and wherein the non-sacrificial layer structure of each sub-stack contains a core layer of a high Ge SiGe alloy at 90% Ge or higher and layers adjacent above and below this core layer, comprising II-VI or III-V alloys that have in their relaxed state a larger lattice parameter than the SiGe alloy in the core layer and a conduction band offset so that the conduction band edge is higher than in the SiGe alloy core layer by approximately 0.15 eV or more.

33. The method of claim 32, wherein the FET is an n-type with the layers strained, wherein the adjacent layers are made of an AlAsSb alloy.

\* \* \* \* \*